(12) United States Patent
Kajigaya

(10) Patent No.: US 8,045,360 B2
(45) Date of Patent: Oct. 25, 2011

(54) SEMICONDUCTOR DEVICE HAVING SINGLE-ENDED SENSING AMPLIFIER

(75) Inventor: Kazuhiko Kajigaya, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 292 days.

(21) Appl. No.: 12/382,495

(22) Filed: Mar. 17, 2009

(65) Prior Publication Data

US 2009/0257268 A1  Oct. 15, 2009

(30) Foreign Application Priority Data

Mar. 17, 2008 (JP) ................................ 2008-068162
Mar. 16, 2009 (JP) ................................ 2009-062364

(51) Int. Cl.
*G11C 11/00* (2006.01)
(52) U.S. Cl. .......... 365/148; 365/63; 365/196; 365/203; 365/205; 365/189.08
(58) Field of Classification Search .................. 365/148, 365/63, 196, 203, 205, 189.08
See application file for complete search history.

(56) References Cited

U.S. PATENT DOCUMENTS

| | | | | |
|---|---|---|---|---|
| 5,892,724 A * | 4/1999 | Hasegawa et al. | ....... | 365/230.03 |
| 6,590,804 B1 | 7/2003 | Perner | | |
| 6,678,198 B2 * | 1/2004 | Issa et al. | ....... | 365/207 |
| 6,687,161 B2 * | 2/2004 | Marotta et al. | ........... | 365/185.21 |
| 6,697,283 B2 * | 2/2004 | Marotta et al. | ........... | 365/185.21 |
| 6,822,904 B2 * | 11/2004 | Gallo et al. | ............... | 365/185.21 |
| 6,999,348 B2 * | 2/2006 | Kanamitsu et al. | ...... | 365/185.25 |
| 7,027,326 B2 * | 4/2006 | Luk et al. | ....... | 365/175 |
| 7,099,216 B2 * | 8/2006 | Luk et al. | ....... | 365/205 |
| 7,499,312 B2 * | 3/2009 | Matick et al. | ................. | 365/154 |
| 7,697,358 B2 * | 4/2010 | Kajigaya | ....... | 365/207 |
| 7,701,794 B2 * | 4/2010 | Kajigaya | ....... | 365/207 |
| 7,869,294 B2 * | 1/2011 | Kajigaya et al. | ............. | 365/207 |
| 7,933,141 B2 * | 4/2011 | Kajigaya et al. | ............. | 365/149 |

FOREIGN PATENT DOCUMENTS

JP  2004-39231  2/2004

\* cited by examiner

*Primary Examiner* — Viet Nguyen

(74) *Attorney, Agent, or Firm* — McGinn IP Law Group, PLLC

(57) ABSTRACT

A sense amplifier in a semiconductor storage device includes a memory cell for storing information on the basis of the size of the resistance value between a signal input/output terminal and a power supply terminal, the semiconductor storage device having a structure in which the bit line capacitance during signal reading from the memory cell is reduced, wherein the amplifier amplifies a signal outputted from an input/output terminal through the use of a single MOS transistor that has a single-ended structure.

24 Claims, 12 Drawing Sheets

Semiconductor Device Having Single-Ended Sensing Amplifier

CROSS REFERENCE TO RELATED APPLICATIONS

This application claims priority, makes reference to, incorporates the same herein, and claims all benefits accruing under 35 U.S.C. §119 from an application for SEMICONDUCTOR DEVICE HAVING SINGLE-ENDED SENSING AMPLIFIER, earlier filed in the Japanese Patent Office on 17 Mar. 2008 and there duly assigned Japanese Patent Application No. 2008-068162, the entire disclosure of which is hereby incorporated by reference in its entirety, and an application for SEMICONDUCTOR DEVICE HAVING SINGLE-ENDED SENSING AMPLIFIER, earlier filed in the Japanese Patent Office on 16 Mar. 2009 and there duly assigned Japanese Patent Application No. 2009-062364, the disclosure of which is hereby incorporated by reference in its entirety.

This application cross references application for commonly-assigned U.S. patent application Ser. No. 12/382,493, now U.S. Pat. No. 7,990,793 (B2) entitled Device having Single-Ended Sensing Amplifier filed on Mar. 17, 2009, the entire contents of which is incorporated herein in its entirety, and commonly assigned U.S. patent application Ser. No. 12/382,494, now U.S. Pat. No. 7,869,294 (B2), entitled Device having Single-Ended Sensing Amplifier filed on Mar. 17, 2009, the entire contents of which is incorporated herein in its entirety.

BACKGROUND OF THE INVENTION

1. Field of the Disclosure

The disclosure relates to a sense amplifier used in a semiconductor device, and particularly relates to a suitable sense amplifier in a semiconductor device that has a variable resistance memory cell, and to a data processing system.

2. Description of Related Art

Conventional memory cells are known that store information based on the size of a resistance value or the "on" current of a transistor. This type of memory cell generally has relatively high resistance values ranging from 10 kΩ to several hundred kilohms (or kilo-ohm) even in a low memory state, and sense amplification is therefore usually performed using a highly sensitive differential current sense amplifier (see Japanese Patent Application Laid-Open No. 2004-39231).

SUMMARY

However, the conventional differential current sense amplifier has a large dedicated surface area, and has drawbacks in that the chip area is significantly increased when this type of sense amplifier is provided for all the bit lines.

The disclosure was therefore developed in view of the foregoing drawbacks, and an object of the disclosure is to provide a sense amplifier and a data processing system whereby a signal voltage is amplified by a single MOS (metal-oxide-semiconductor) transistor, and the chip area is thereby prevented from increasing.

The disclosure for overcoming the above-mentioned drawbacks includes the aspects described below.

(1) The disclosure provides a semiconductor device comprising: a memory cell for storing information based on a resistance value between an input/output terminal and a power supply terminal, or an ON current value of a cell transistor connected to the input/output terminal; a bit line connected to the input/output terminal for inputting/outputting the information to/from the memory cell; a first field-effect transistor that works as a single-ended sense amplifier having a gate connected to the bit line for amplifying a data signal on the bit line; a second field-effect transistor connected to the bit line for controlling a potential of the bit line to a first predetermined potential; a third field-effect transistor for supplying an output signal of the first field-effect transistor to a global bit line; and a global bit line sense amplifier connected to the global bit line for detecting a signal on the global bit line, wherein the first predetermined potential of the bit line varies in accordance with a current flowing through the memory cell, and the first field-effect transistor flows a current in accordance with the varied potential of the bit line.

(2) The disclosure also provides a semiconductor device comprising: a memory cell for storing information based on a resistance value between an input/output terminal and a power supply terminal, or an ON current value of a cell transistor connected to the input/output terminal; a bit line connected to the input/output terminal for inputting/outputting the information to/from the memory cell; a first field-effect transistor that works as a single-ended sense amplifier having a gate connected to the bit line for amplifying a data signal on the bit line; a second field-effect transistor connected to the bit line for controlling a potential of the bit line to a first predetermined potential; a third field-effect transistor for supplying an output signal of the first field-effect transistor to a global bit line; and a global bit line sense amplifier connected to the global bit line for detecting a signal on the global bit line, wherein the second field-effect transistor is brought into a conductive state so as to set the bit line to the first predetermined potential before the memory cell is accessed, and the first predetermined potential of the bit line varies in accordance with a current flowing through the memory cell after the memory cell is accessed, and the first field-effect transistor flows a current in accordance with the varied potential of the bit line.

(3) The disclosure also provides a semiconductor device comprising: a memory cell for storing information based on a resistance value between an input/output terminal and a power supply terminal, or an ON current value of a cell transistor connected to the input/output terminal; a bit line connected to the input/output terminal for inputting/outputting the information to/from the memory cell; a first field-effect transistor that works as a single-ended sense amplifier having a gate connected to the bitline for amplifying a data signal on the bit line; a second field-effect transistor connected to the bit line for controlling a potential of the bit line to a first predetermined potential; a third field-effect transistor for supplying an output signal of the first field-effect transistor to a global bit line; and a global bit line sense amplifier connected to the global bit line for detecting a signal on the global bit line, wherein the first predetermined potential of the bit line varies in accordance with a current flowing through the memory cell and a current flowing through the second field-effect transistor, and the first field-effect transistor flows a current in accordance with the varied potential of the bit line.

Through the disclosure, a configuration is adopted whereby the bit line capacitance is reduced when a signal is read from a memory cell, and rapid charging and discharging are thereby made possible even through a variable resistance memory cell having high resistance. The signal is therefore amplified by a single MOS transistor, and the surface area of the sense amplifier can thereby be significantly reduced.

Since a sense amplifier can be provided to all of the bit lines through the use of a hierarchical bit line structure, memory can be provided that is compatible with a DRAM (dynamic random access memory) based on a page-open policy.

Furthermore, through the use of a hierarchical bit line structure in which a plurality of sense amplifiers is connected to a global bit line, and information reading and writing control are performed through a global sense amplifier, compatibility with DRAM can be maintained while keeping the chip area and current consumption from increasing.

BRIEF DESCRIPTION OF THE DRAWINGS

The above features and advantages of the disclosure will be more apparent from the following description of certain preferred example embodiments taken in conjunction with the accompanying drawings, in which.

DETAILED DESCRIPTION OF THE EMBODIMENTS

Figure 1:
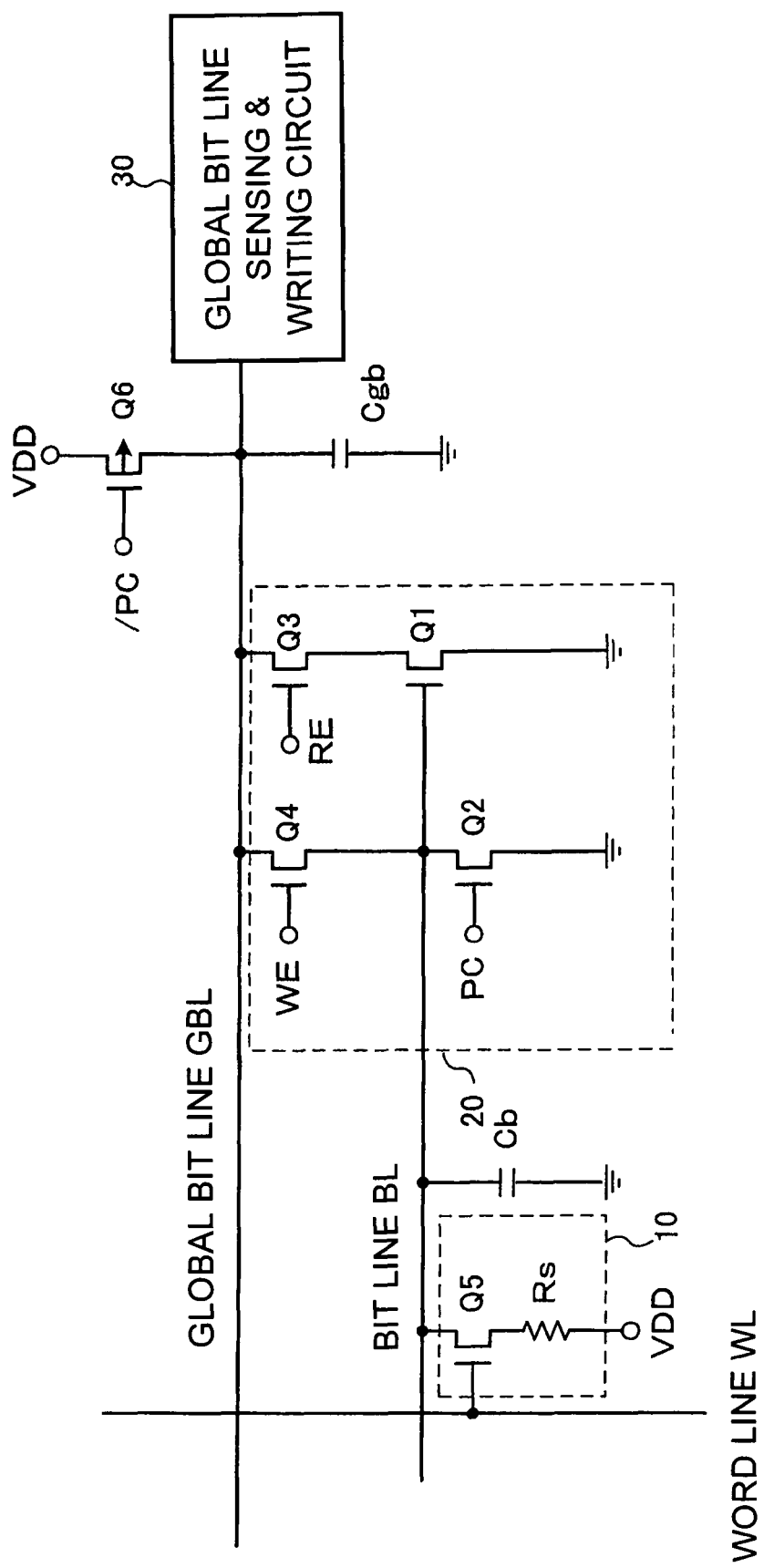
FIG. 1 is a diagram showing the structure of the sense amplifier and variable resistance memory cell according to Embodiment 1.

Embodiments of the disclosure will be described in detail hereinafter with reference to the accompanying drawings.

The constituent elements in the embodiments described herein can be substituted with existing constituent elements and the like, and various variations, including combinations with other existing constituent elements, are also possible.

The scope of the present invention as described in the claims is thus not limited by the embodiments described herein.

Embodiment 1

Embodiment 1 of the disclosure will be described using FIGS. 1 and 2. In the present embodiment, an example will be described of a memory array having a hierarchical bit line structure as a semiconductor device. The length of a bit line that is a local bit line to which a plurality of memory cells is connected can be reduced in the case of a hierarchical bit line structure, and the bit line capacitance is therefore reduced and the amplitude of signals read from the memory cell can be increased. A hierarchical bit line structure is thus a preferred example, but the disclosure is not limited to this example.

The configuration of the present embodiment is a technique relating to a single-ended sense amplifier in which a single signal is inputted, only one signal is amplified, and the amplified signal is outputted. A common differential sense amplifier has a higher gain than a single-ended sense amplifier and is also more resistant to noise. The high gain of a differential sense amplifier also reduces the time taken to vary the amplified output signal. On the other hand, a single-ended sense amplifier is extremely sensitive to noise, and requires a higher input signal in order to generate an amplified output. The aforementioned sense amplifier connected to the bit line is a single-ended sense amplifier.

Furthermore, it is sufficient insofar as the transistor is a field-effect transistor (FET), and besides a MOS (Metal Oxide Semiconductor), the disclosure can also be applied to a MIS (Metal-Insulator Semiconductor) transistor and various other FETs. An NMOS transistor is a typical example of a first-conductivity-type transistor (i.e., n-type), and PMOS transistor is a typical example of a second-conductivity-type transistor (i.e., p-type).

Furthermore, in the disclosure, the bit line voltage is controlled by a common internal voltage (e.g., an internal power supply voltage that is stepped down from an external power supply) for driving the memory cell, a VSS power supply, or another voltage. For example, a characteristic feature of the embodiments is that the bit line voltage after the memory cell is accessed is transitioned in one direction (of the VSS or the internal power supply voltage) from the internal power supply voltage or the prescribed potential of the VSS, regardless of whether the memory cell information is "1" or "0." In a semiconductor device in which the voltages of the external power supply and internal power supply of the semiconductor device are lowered to near 1 V (a voltage that is near the limit of the operating point at which a CMOS-type sense amplifier operates), the control voltage of the bit line combines with a sensing scheme that utilizes the single-ended sense amplifier to produce enhanced synergistic effects of higher speed and stability, and circuit stability due to variations in manufacturing conditions.

<Structure of the Memory Cell and Sense Amplifier>

FIG. 1 is a diagram showing the circuits of portion of a variable resistance memory cell that includes a sense amplifier that corresponds to the variable resistance memory cell according to the present embodiment.

FIG. 1 shows a word line WL, a bit line BL, a memory cell 10 provided at the junction of the word line WL and the bit line BL, a sense amplifier 20, a global bit line GBL, and a global bit line sensing and writing circuit 30.

In this arrangement, the bit line BL is connected to the gate of an nMOS transistor Q1 constituting the sense amplifier, and a signal voltage read to the bit line is sensed/amplified and converted to a drain current. A pre-charge signal PC is inputted to the gate of a bit line pre-charge nMOS transistor Q2, and the bit line BL is pre-charged to a ground potential VSS when PC is in a high state.

A selection signal RE is received by the gate of a sense amplifier read selection nMOS transistor Q3, and the global bit line GBL and the drain of the nMOS transistor Q1 that is the output node of the sense amplifier are selectively connected. A selection signal WE is received by the gate of a sense amplifier write selection nMOS transistor Q4, and the bit line BL and the global bit line GBL are selectively connected.

It is sufficient insofar as the nMOS transistor Q3 and the nMOS transistor Q1 are connected in series, and the sequential relation thereof is essentially unlimited. Ideally, since a large number of nMOS transistors Q3 are connected to the global bit line GBL, the nMOS transistor Q3 should be connected on the side of the global bit line GBL as shown in FIG. 1 when the low noise effects of the global bit line GBL are emphasized.

A plurality of bit lines BL and a plurality of memory cells are connected to the global bit line GBL via a plurality of other sense amplifiers not shown in the drawing, and at the time of a read operation, the nMOS transistor Q3 connects to the global bit line GBL and only the sense amplifier to which the selected memory cell belongs. As a result, the nMOS transistor Q1 drives the global bit line GBL in accordance with the signal read to the bit line BL, and the global bit line sensing and writing circuit 30 latches the signal transferred to the global bit line GBL and outputs to an external circuit (not shown).

A "single-ended sense amplifier (sense amplifier 20) for first amplifying the information of the memory cell 10, which is the data signal, via a local bit line" is connected to the hierarchical bit line structure. The sense amplifier 20 includes an amplifier Q1 that is a single-ended sense amplifier, and a selection transistor Q3 for reading that connects the output of the amplifier to the global bit line GBL.

The selection transistor Q3 includes a control signal for connecting the global bit line GBL and the output of the amplifier, but the control signal may also include an address signal or other selection information for selecting a plurality of local bit lines and a single global bit line. In general, since numerous memory cells and sense amplifier 20 are connected to a local bit line BL to form a memory array, the wiring pitch of the local bit line BL is equal to or smaller than the wiring pitch of the global bit line GBL.

At the time of a write operation, the nMOS transistor Q4 connects to the global bit line GBL and only the sense amplifier to which the selected memory cell belongs. When the global bit line sensing and writing circuit 30 receives write data from an external circuit not shown in the drawing, and drives the global bit line GBL, the bit line BL is driven via the nMOS transistor Q4, and this results in data being written to the memory cell.

The memory cell 10 is composed of a selection nMOS transistor Q5 and a resistor element Rs for storing data on the basis of the size of a resistance value. The gate of the nMOS transistor Q5 is connected to the word line WL, the drain is connected to the bit line BL, and the source is connected to one terminal of the resistor element Rs. The other terminal of the resistor element Rs is connected to the power supply potential VDD.

A plurality of other memory cells not shown in the drawing is connected to the bit line BL, and as a result, the parasitic capacitance Cb of the bit line BL in the present embodiment is 10 fF (femto-Farads), for example. Although not particularly limited, the lower limit Rs[H]min of the resistance distribution of the high-resistance state in the resistor element Rs of the present embodiment is 100 MΩ (mega-ohms), and the upper limit Rs[L]max of the resistance distribution of the low-resistance state is 100 KΩ (kilo-ohms). As a result, the time constant T of the system composed of the resistor element Rs and the bit line parasitic capacitance Cb is 1 μs (micro-second) or higher when the resistor element is in the high-resistance state, and 1 ns (nano-second) or lower when the resistor element is in the low-resistance state.

The flow of current to the memory cell is a natural result of the first power supply (VDD) that is the power supply of the memory cell 10 having a different voltage value than the third power supply (VSS) that is the power supply of the nMOS transistor Q2, and regarding the bit line voltages that are in accordance with the previously described difference in time constants according to at least a difference in memory cell information, it is possible to adjust the difference between each current fed by the nMOS transistor Q1 to correspond to the bit line voltages. Specifically, when the lower limit Rs[H]min of the resistance distribution of the high-resistance state is 10 MΩ, the current fed by the nMOS transistor Q1 can be maintained by somewhat increasing the first power supply (VDD). This can be done by changing the value (relative value) of the differential voltage between the first power supply (VDD) and the third power supply (VSS), for example, and has the effect of making it possible to provide optimum sensing in accordance with fluctuation of the current value fed by the memory cell due to the write characteristics and the like of the memory cell. Furthermore, the difference in voltage values between the second power supply (VSS) connected to the nMOS transistor Q1 and the fourth power supply (VDD) connected to the nMOS transistor Q6 described hereinafter has the same effects as previously described. The difference in voltage values between the third power supply and the fourth power supply also has the same effects. On the other hand, having the same voltage value for the third power supply and the fourth power supply makes it possible for the power supply wiring of both power supplies arranged in a mesh to be shared in a memory array composed of a plurality of memory cells.

Consequently, during reading, since an adequate difference in the potential of the bit line BL several ns after the nMOS transistor Q5 turns on and the bit line BL begins charging and discharging is produced by the size of the resistance value of the resistor element, a sense amplification operation can be executed by the nMOS transistor Q1 with a margin by setting the sense period within this several ns. The number of memory cells connected to the bit line BL may be set to various numbers in accordance with the operating principle described above so that a parasitic capacitance computed in accordance with the resistance value of the memory cells and the planned duration of the sense period is obtained.

A global bit line pre-charge pMOS transistor Q6 receives the inverse signal /PC of the pre-charge signal PC at the gate thereof, and the global bit line GBL is pre-charged to the power supply potential VDD when /PC is in a low state. The parasitic capacitance of the global bit line is indicated as Cgb.

<Operational Waveform of the Sense Amplifier During Reading>

Figures 2A, 2B:
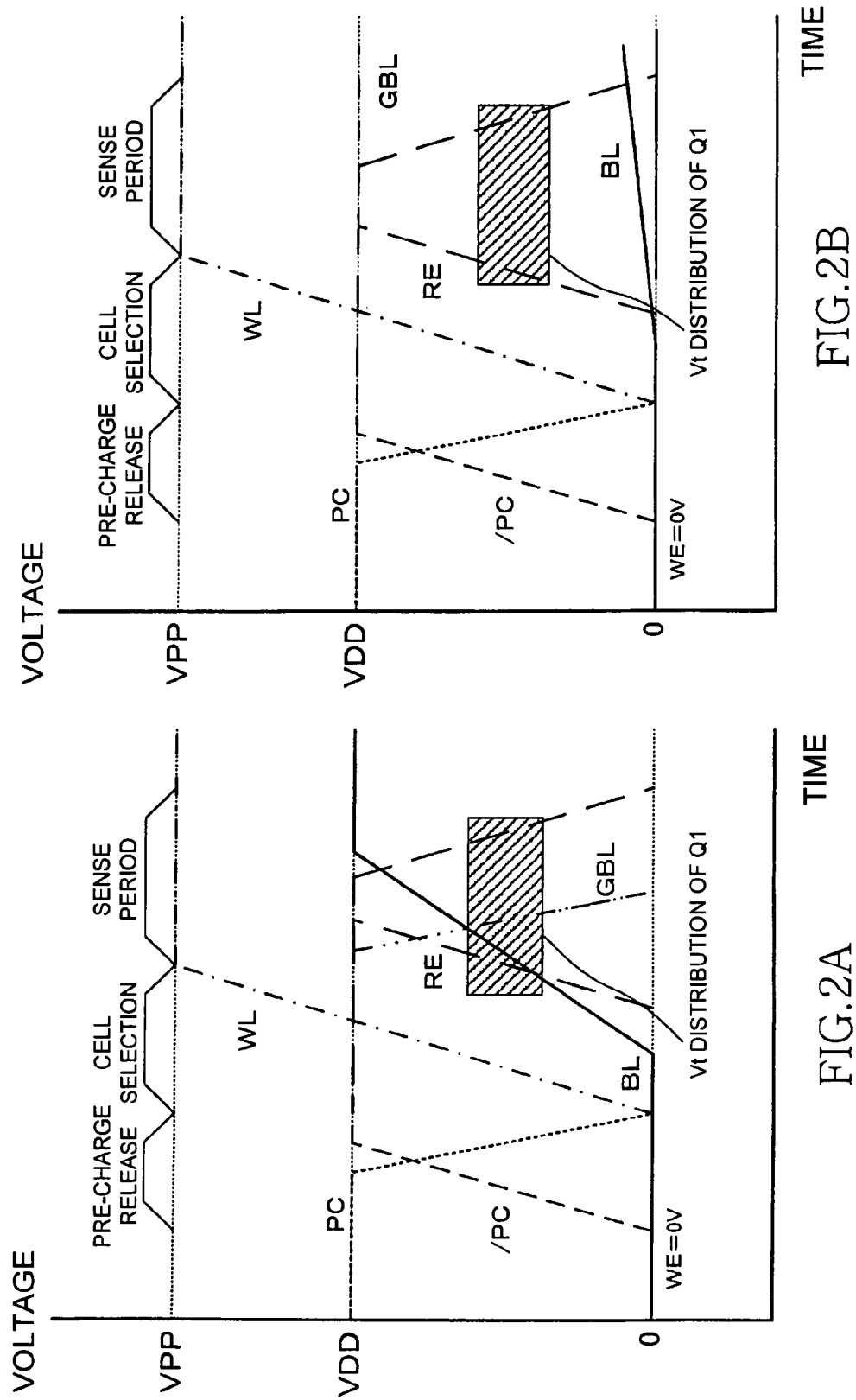
FIG. 2 is a diagram showing the operational waveform in the sense amplifier according to Embodiment 1.

FIG. 2 is a diagram showing the operational waveform of the sense amplifier during reading. The horizontal axis indicates time, and the vertical axis indicates voltage. FIG. 2A shows a case of reading a low-resistance state of the memory cell, and FIG. 2B shows a case of reading a high-resistance state.

First, in the case of reading a low-resistance state, PC is low and /PC is high in the pre-charge release period, the nMOS transistor Q2 and the pMOS transistor Q6 each turn off (become nonconductive), and the bit line BL and the global bit line GBL are floating in a state of being pre-charged to VSS and VDD, respectively. In other words, the nMOS transistor Q2 controls the bit line to a first predetermined potential (VSS) before information is outputted to the bit line from the memory cell. This operation has at least the effect of clearing history information of a different memory cell read in a previous cycle.

Then, when the cell selection period occurs, a signal voltage is read to the bit line BL at a time constant that corresponds to the low-resistance state of the memory cell 10 when the word line WL has changed to high (the nMOS transistor Q5 had become conductive), and when the selection signal RE changes to high (the nMOS transistor Q3 becomes conductive), the sense period begins, and the sense period ends when RE changes to low (the nMOS transistor Q3 becomes nonconductive).

In the sense period, since the potential of the bit line is higher than the upper limit of the distribution of the threshold voltage Vt of the nMOS transistor Q1, the drain current of the nMOS transistor Q1 is large, and the charge charged by the parasitic capacitance Cgb of the global bit line GBL withdraws rapidly. The potential of the global bit line GBL therefore rapidly discharges from VDD to VSS.

In other words, the nMOS transistor Q3 is in a conductive state for a predetermined time after the memory cell is accessed, the nMOS transistor Q1 feeds a current in accordance with the transitioned voltage of the bit line, and the potential of the global bit line is transitioned.

The reason for maintaining a conductive state for a predetermined time is that at least the potential of the bit line transitions at a different time constant in accordance with the memory cell information, and after an extremely long time, the bit line voltage reaches VDD for all information. In other words, the transmission of a signal corresponding to the memory cell information to the global bit line must be executed within a time in which the difference in time constants is indicated as the difference in bit line voltages. Causing the nMOS transistor Q3 to be conductive for a predetermined time denotes applying a voltage as memory cell information to the global bit line only during the time of an optimum bit line voltage state (the state of the current fed by the single sense amplifier nMOS transistor Q1), and has the effect of preventing malfunctioning of the sense amplifier on the global bit line.

The potential of the global bit line GBL at the end of the sense period is VSS, and this potential is detected as low by the global bit line sensing and writing circuit 30 and read as low data. The distribution of the threshold voltage Vt of the nMOS transistor Q1 indicates the range of variation of the threshold voltage due to such factors as dimensional variation at the time of manufacturing, variation of the gate insulation film thickness, and fluctuation of the channel impurity distribution.

In the case of reading a high resistance state, PC is first low and /PC is high in the pre-charge release period, the nMOS transistor Q2 and the pMOS transistor Q6 each turn off, and the bit line BL and the global bit line GBL are floating in a state of being pre-charged to VSS and VDD, respectively.

Then, when the cell selection period occurs, a signal voltage is read to the bit line BL at a time constant that corresponds to the high-resistance state of the memory cell 10 when the word line WL has changed to high, and when the selection signal RE changes to high, the sense period begins, and the sense period ends when RE changes to low.

During the sense period, since the potential of the bit line remains lower than the lower limit of the distribution of the threshold voltage Vt of the nMOS transistor Q1, the drain current of the nMOS transistor Q1 is small, and there is almost no withdrawal of the charge that is charged by the parasitic capacitance Cgb of the global bit line GBL. Since the potential of the global bit line GBL at the end of the sense period stays substantially at VDD, the potential is detected as high by the global bit line sensing and writing circuit 30 and read as high data.

The period during which the nMOS transistor Q2 is brought to a conductive state by the pre-charge signal PC may overlap with the conductive period of the memory cell. This enables stable read characteristics to be provided in the single-ended sense amplifier. Specifically, the first predetermined potential of the bit line undergoes a transition according to the current fed by the memory cell and the current fed by the nMOS transistor Q2, and the nMOS transistor Q1 feeds a current in accordance with the transitioned voltage of the bit line, whereby the aforementioned floating period can be eliminated, and noise-resistant sensing is made possible. Furthermore, the period during which the pMOS transistor Q6 is brought to a conductive state by the inverse signal /PC of the pre-charge signal PC may overlap with the conductive period of the nMOS transistor Q1. The effects of this overlap are the same as the previously described effects.

Embodiment 2

Embodiment 2 of the disclosure will be described using FIGS. 3 and 4.

Figure 3:
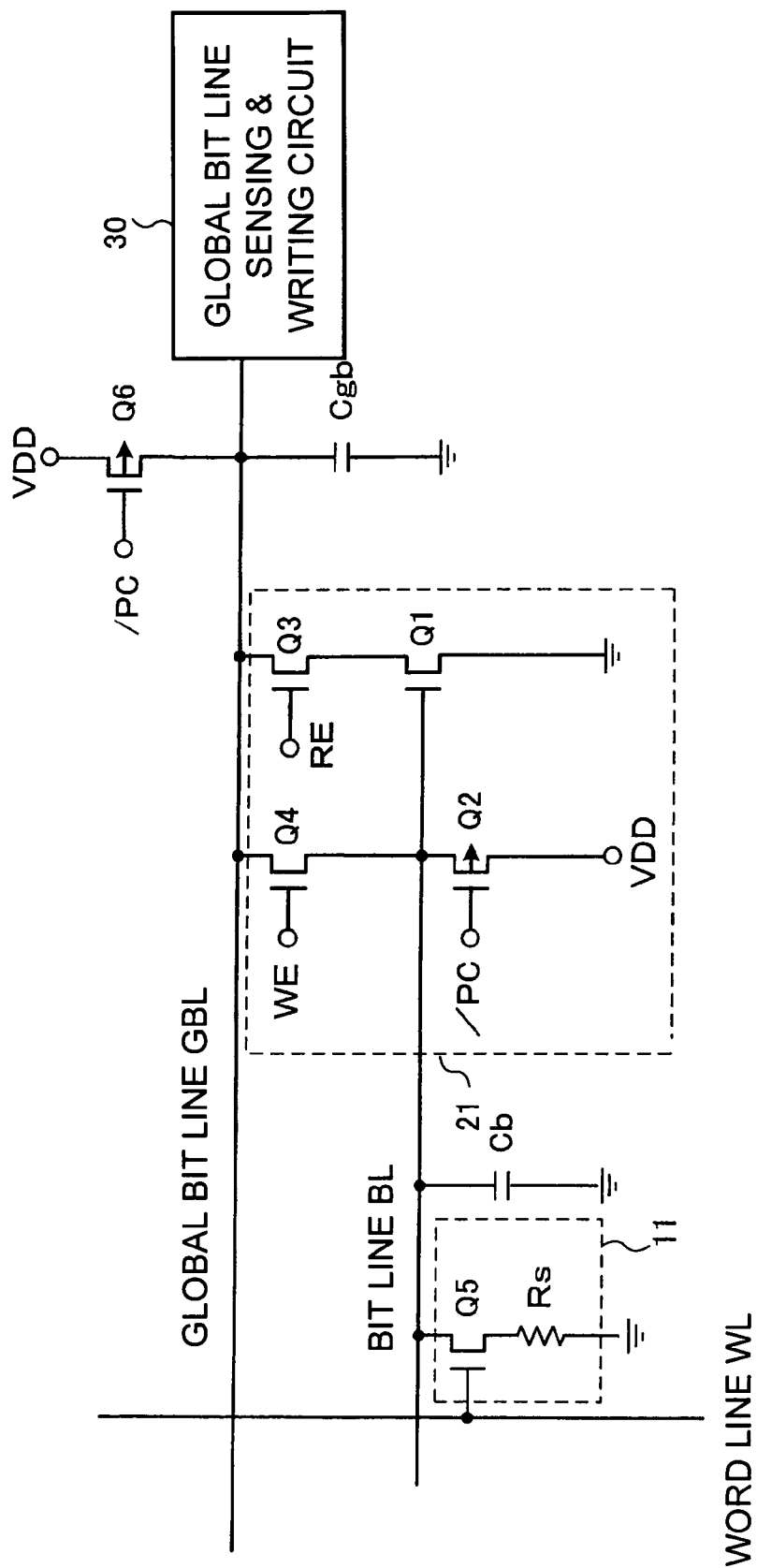
FIG. 3 is a diagram showing the structure of the sense amplifier and variable resistance memory cell according to Embodiment 2.

FIG. 3 shows the circuits of a portion of a variable resistance memory cell array that includes a sense amplifier 21 that corresponds to the variable resistance memory cell according to the present embodiment. The basic structure shown is the same as that of Embodiment 1, and only the differing components will be described below.

<Structure of the Memory Cell and Sense Amplifier>

The inverse signal /PC of the pre-charge signal PC is inputted to the gate of the bit line pre-charge pMOS transistor Q2, and the bit line BL is pre-charged to the power supply potential VDD when /PC is in a low state.

A memory cell 11 is composed of the selection nMOS transistor Q5 and the resistor element Rs for storing data on the basis of the size of a resistance value. The gate of the nMOS transistor Q5 is connected to the word line WL, the drain is connected to the bit line BL, and the source is connected to one terminal of the resistor element Rs. The other terminal of the resistor element Rs is connected to a ground potential VSS.

<Operational Waveform of the Sense Amplifier During Reading>

Figure 4:
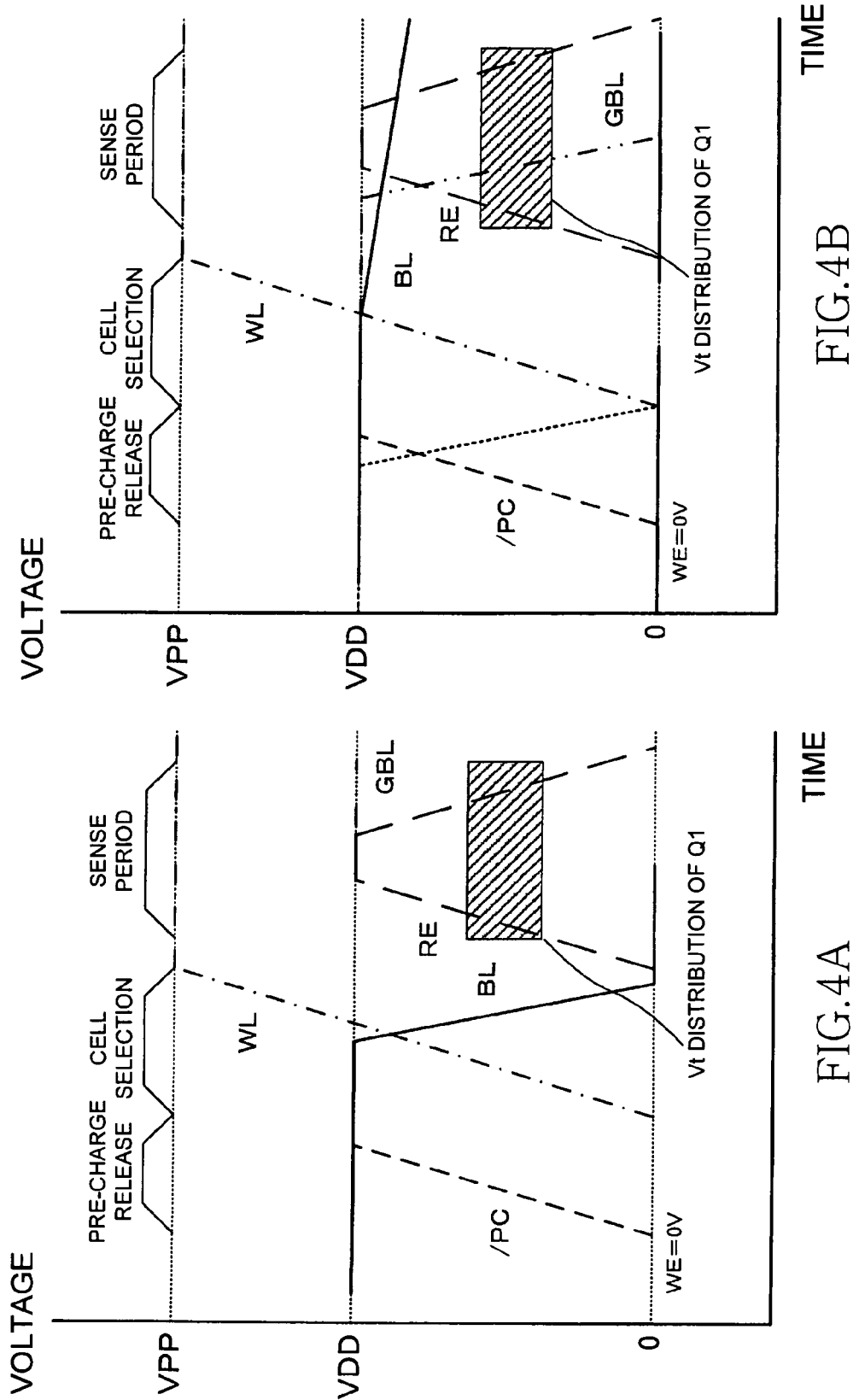
FIG. 4 is a diagram showing the operational waveform in the sense amplifier according to Embodiment 2.

FIG. 4 is a diagram showing the operational waveform of the sense amplifier 21 during reading. Since the basic operation is the same as in Embodiment 1, only the differing parts will be described below.

Referring to FIG. 4A, first, in the case of reading a low-resistance state, /PC changes to high in the pre-charge release period, the pMOS transistor Q2 and the pMOS transistor Q6 each turn off, and the bit line BL and the global bit line GBL are floating in a state of being pre-charged to VDD (i.e., positive supply voltage).

Then, when the cell selection period occurs, a signal voltage is read to the bit line BL at a time constant that corresponds to the low-resistance state of the memory cell 11 when the word line WL has changed to high. When the selection signal RE subsequently changes to high, the sense period begins, and the sense period ends when RE changes to low.

During the sense period, since the potential of the bit line BL is lower than the lower limit of the distribution of the threshold voltage Vt of the nMOS transistor Q1, the drain current of the nMOS transistor Q1 is small, and there is almost no withdrawal of the charge that is charged by the parasitic capacitance Cgb of the global bit line GBL.

Since the potential of the global bit line GBL at the end of the sense period stays substantially at VDD, the potential is detected as high by the global bit line sensing and writing circuit 30, inverted by an inversion circuit (not shown), and read as low data.

Referring to FIG. 4B, in the case of reading a high-resistance state, /PC first changes to high in the pre-charge release period, the pMOS transistor Q2 and the pMOS transistor Q6 each turn off, and the bit line BL and the global bit line GBL are floating in a state of being pre-charged to VDD.

Then, when the cell selection period occurs, a signal voltage is read to the bit line BL at a time constant that corresponds to the high-resistance state of the memory cell 11 when the word line WL has changed to high. When the selection signal RE subsequently changes to high, the sense period begins, and the sense period ends when RE changes to low.

During the sense period, since the potential of the bit line BL remains higher than the upper limit of the distribution of the threshold voltage Vt of the nMOS transistor Q1, the drain current of the nMOS transistor Q1 is large, and the charge that is charged by the parasitic capacitance Cgb of the global bit line GBL withdraws rapidly. The potential of the global bit line GBL is therefore rapidly discharged to VSS (negative supply, or ground potential). The potential of the global bit line GBL at the end of the sense period is VSS, and this potential is detected as low by the global bit line sensing and writing circuit 30, inverted by an inversion circuit (not shown), and read as high data.

Embodiment 3

Embodiment 3 of the disclosure will be described using FIGS. 5 and 6.

Figure 5:
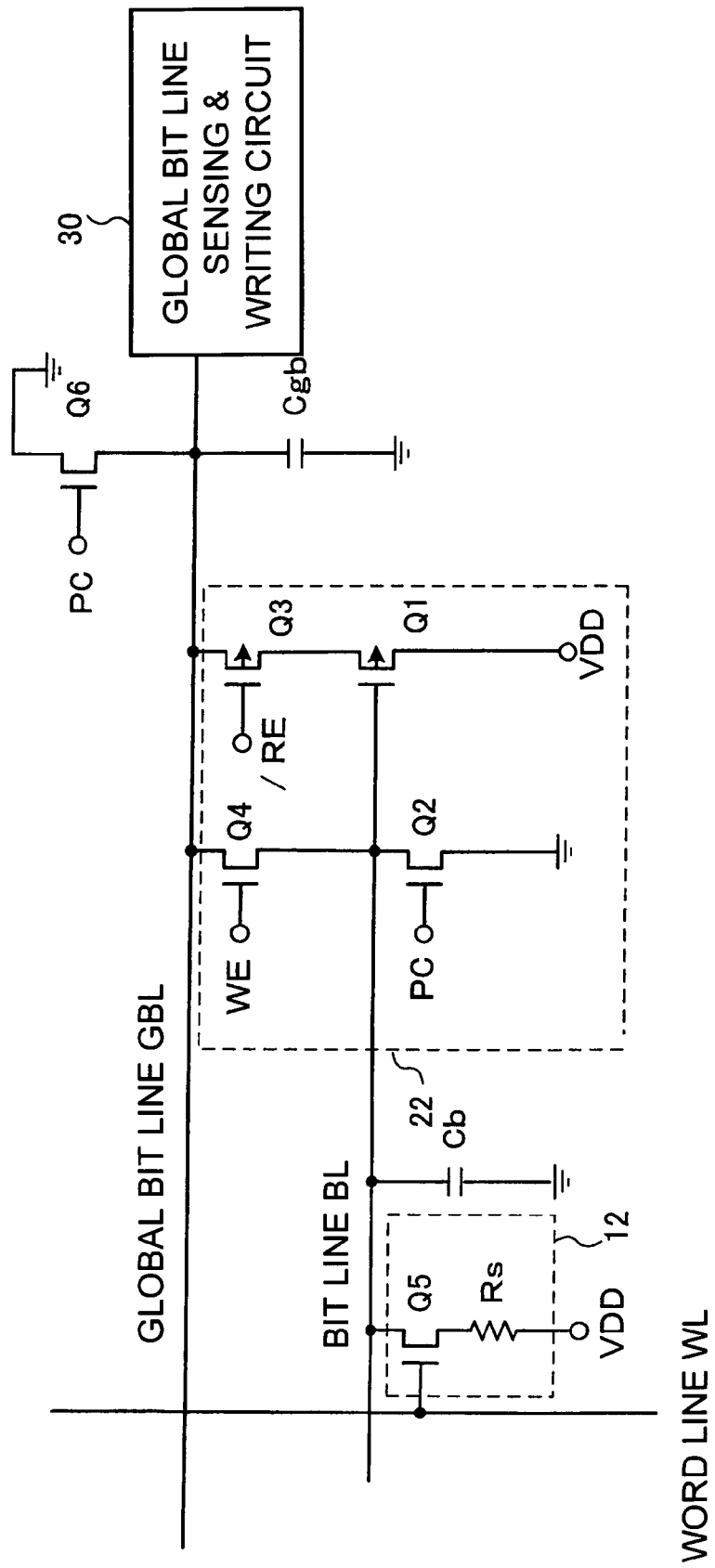
FIG. 5 is a diagram showing the structure of the sense amplifier and variable resistance memory cell according to Embodiment 3.

FIG. 5 shows the circuits of a portion of a variable resistance memory cell array that includes a sense amplifier 22 that corresponds to the variable resistance memory cell according to the present embodiment. The basic structure shown is the same as that of Embodiment 1, and only the differing components will be described below.

<Structure of the Memory Cell and Sense Amplifier>

The bit line BL is connected to the gate of a pMOS transistor Q1 that constitutes the sense amplifier 22, and the pMOS transistor Q1 senses/amplifies a signal voltage read to the bit line and converts the signal voltage to a drain current. A sense amplifier read selection pMOS transistor Q3 receives the inverse signal/RE of a selection signal at the gate thereof, and selectively connects the global bit line GBL and the drain of the pMOS transistor Q1 that is the output node of the sense amplifier 22. A global bit line pre-charge nMOS transistor Q6 receives the pre-charge signal PC at the gate thereof, and the global bit line GBL is pre-charged to the ground potential VSS when PC is in a high state.

<Operational Waveform of the Sense Amplifier During Reading>

FIG. 6 is a diagram showing the operational waveform of the sense amplifier 22 during reading. Since the basic operation is the same as in Embodiment 1, only the differing parts will be described below.

Figure 6A:
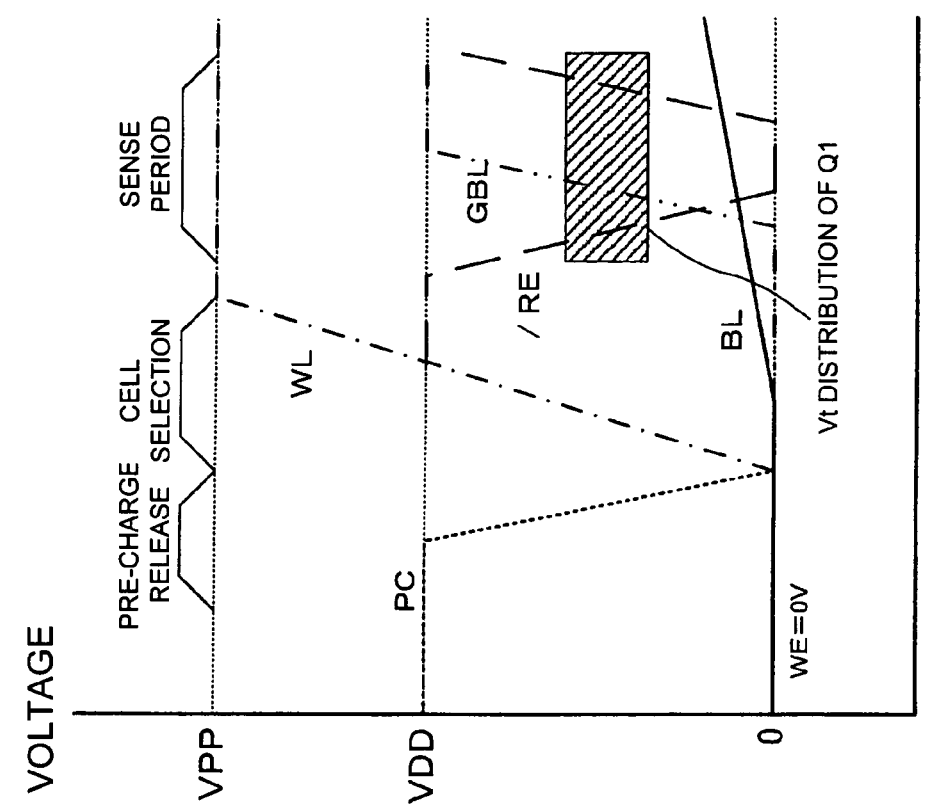
FIG. 6 is a diagram showing the operational waveform in the sense amplifier according to Embodiment 3.
Figure 6B:
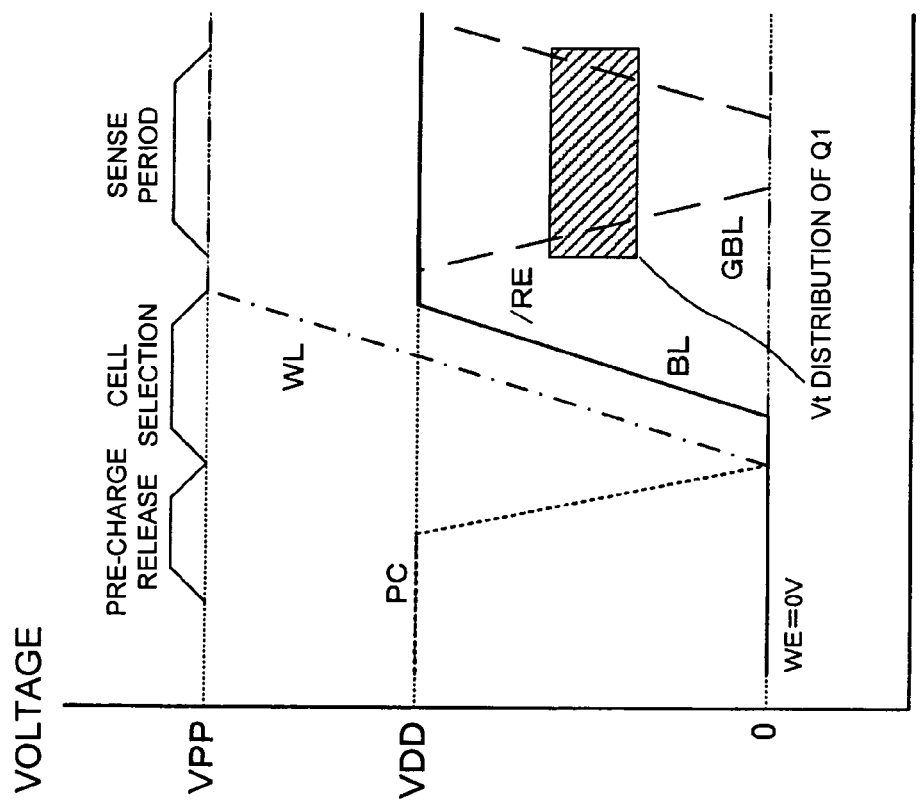

Referring to FIG. 6A, first, in the case of reading a low-resistance state, PC changes to low in the pre-charge release period, the nMOS transistor Q2 and the nMOS transistor Q6 each turn off, and the bit line BL and the global bit line GBL are floating in a state of being pre-charged to VSS.

Then, when the cell selection period occurs, a signal voltage is read to the bit line BL at a time constant that corresponds to the low-resistance state of the memory cell 12 when the word line WL has changed to high. When the inverse signal /RE of the selection signal RE subsequently changes to low, the sense period begins, and the sense period ends when /RE changes to high.

During the sense period, since the potential of the bit line BL is higher than the upper limit of the distribution of the threshold voltage Vt of the pMOS transistor Q1, the drain current of the pMOS transistor Q1 is small, and there is almost no charging of the parasitic capacitance Cgb of the global bit line GBL.

Since the potential of the global bit line GBL at the end of the sense period stays substantially at VSS, the potential is detected as low by the global bit line sensing and writing circuit 30 and read as low data.

In the case of reading a high-resistance state, PC first changes to low in the pre-charge release period, the nMOS transistor Q2 and the nMOS transistor Q6 each turn off, and the bit line BL and the global bit line GBL are floating in a state of being pre-charged to VSS.

Then, when the cell selection period occurs, a signal voltage is read to the bit line BL at a time constant that corresponds to the high-resistance state of the memory cell 12 when the word line WL has changed to high. When the inverse signal /RE of the selection signal RE subsequently changes to low, the sense period begins, and the sense period ends when /RE changes to high.

During the sense period, since the potential of the bit line BL remains lower than the lower limit of the distribution of the threshold voltage Vt of the pMOS transistor Q1, the drain current of the pMOS transistor Q1 is large, and the parasitic capacitance Cgb of the global bit line GBL charges rapidly. The potential of the global bit line GBL is therefore rapidly charged from VSS to VDD. The potential of the global bit line GBL at the end of the sense period is VDD, and this potential is detected as high by the global bit line sensing and writing circuit 30 and read as high data.

Embodiment 4

Embodiment 4 of the disclosure will be described using FIGS. 7 and 8.

Figure 7:
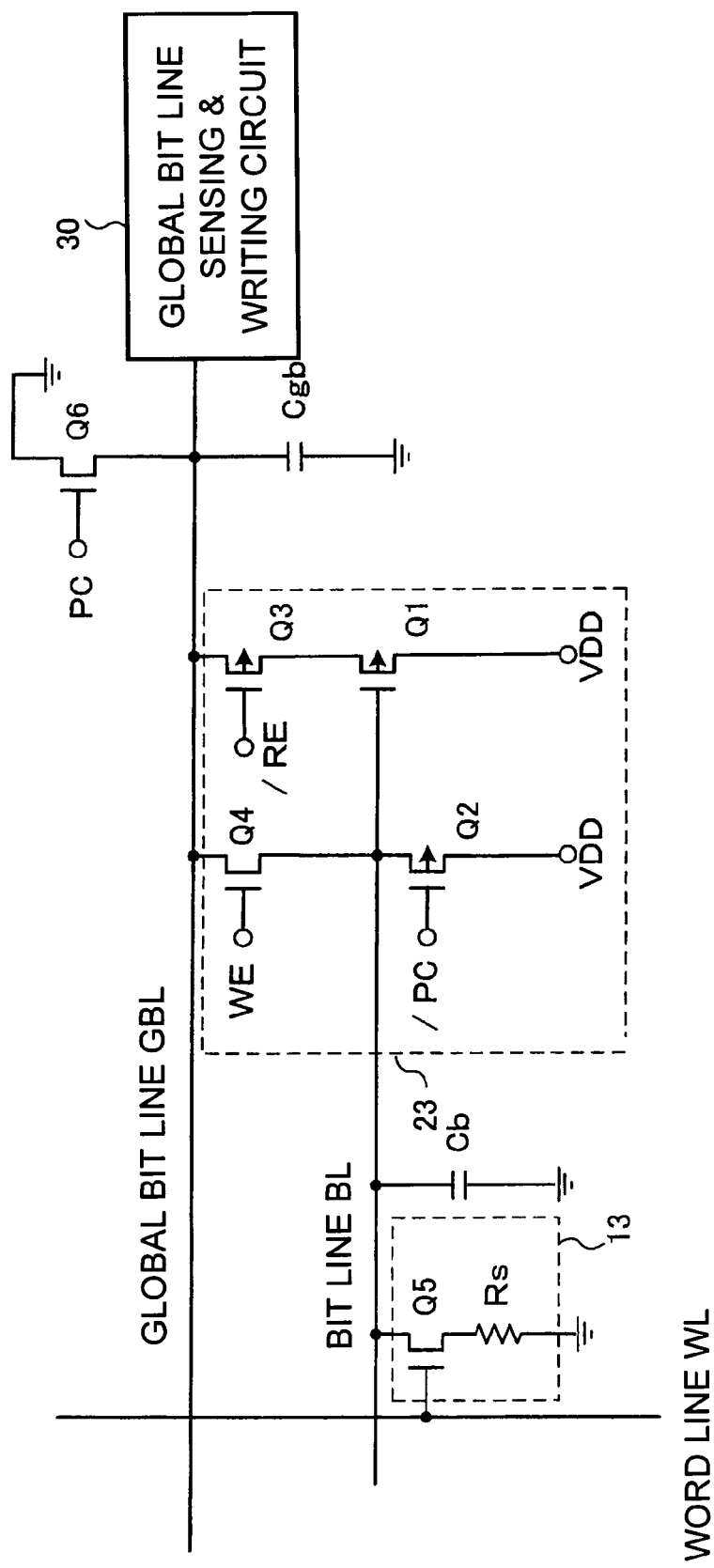
FIG. 7 is a diagram showing the structure of the sense amplifier and variable resistance memory cell according to Embodiment 4.

FIG. 7 shows the circuits of a portion of a variable resistance memory cell array that includes a sense amplifier 23 that corresponds to the variable resistance memory cell according to the present embodiment. The basic structure shown is the same as that of Embodiment 1, and only the differing components will be described below.

<Structure of the Memory Cell and Sense Amplifier>

The bit line BL is connected to the gate of a pMOS transistor Q1 that constitutes the sense amplifier 23, and the pMOS transistor Q1 senses/amplifies a signal voltage read to the bit line and converts the signal voltage to a drain current. The inverse signal /PC of the pre-charge signal PC is inputted to the gate of a bit line pre-charge pMOS transistor Q2, and the bit line BL is pre-charged to the power supply potential VDD when /PC is in a low state.

A sense amplifier read selection pMOS transistor Q3 receives the inverse signal/RE of a selection signal RE at the gate thereof, and selectively connects the global bit line GBL and the drain of the pMOS transistor Q1 that is the output node of the sense amplifier 23.

The memory cell 13 is composed of a selection nMOS transistor Q5 and a resistor element Rs for storing data on the basis of the size of a resistance value. The gate of the nMOS transistor Q5 is connected to the word line WL, the drain is connected to the bit line BL, and the source is connected to one terminal of the resistor element Rs. The other terminal of the resistor element Rs is connected to the ground potential VSS.

The global bit line pre-charge nMOS transistor Q6 receives the pre-charge signal PC at the gate thereof, and the global bit line GBL is pre-charged to the ground potential VSS when PC is in a high state.

<Operational Waveform of the Sense Amplifier During Reading>

FIG. 8 is a diagram showing the operational waveform of the sense amplifier 23 during reading. Since the basic operation is the same as in Embodiment 1, only the differing parts will be described below.

Figures 8A, 8B:
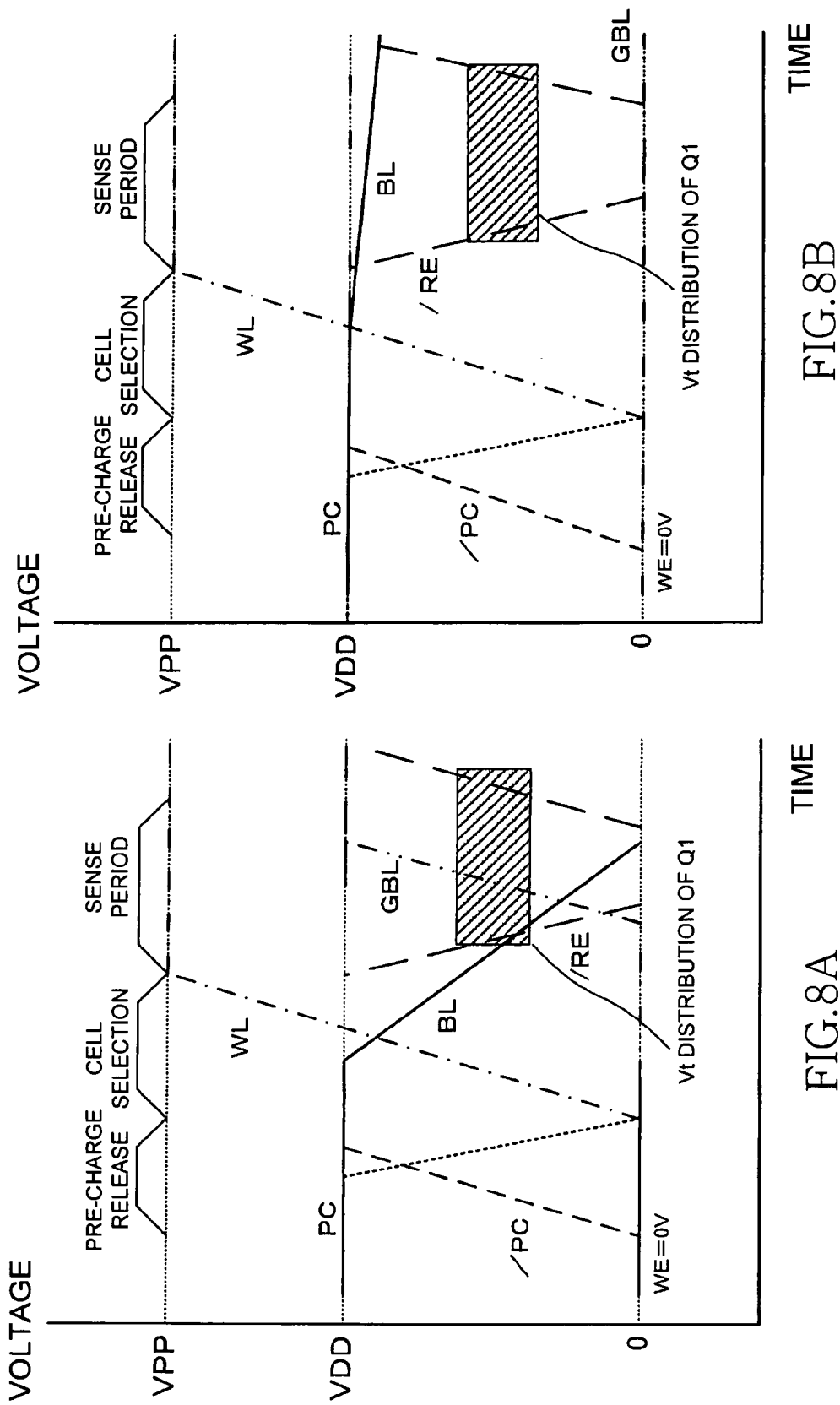
FIG. 8 is a diagram showing the operational waveform in the sense amplifier according to Embodiment 4.

Referring to FIG. 8A, in the case of reading a low-resistance state, PC changes to low and /PC changes to high in the pre-charge release period, the pMOS transistor Q2 and the nMOS transistor Q6 each turn off, and the bit line BL and the global bit line GBL are floating in a state of being pre-charged to VDD and VSS, respectively.

Then, when the cell selection period occurs, a signal voltage is read to the bit line BL at a time constant that corresponds to the low-resistance state of the memory cell 13 when the word line WL has changed to high. When the inverse signal /RE of the selection signal subsequently changes to low, the sense period begins, and the sense period ends when /RE changes to high.

During the sense period, since the potential of the bit line BL remains lower than the lower limit of the distribution of the threshold voltage Vt of the pMOS transistor Q1, the drain current of the pMOS transistor Q1 is large, and the potential of the global bit line GBL is rapidly charged from VSS to VDD.

The potential of the global bit line GBL at the end of the sense period is VDD, and this potential is detected as high by the global bit line sensing and writing circuit 30, inverted by an inversion circuit (not shown), and read as low data.

Referring to FIG. 8B, in the case of reading a high-resistance state, PC first changes to low and /PC changes to high in the pre-charge release period, the pMOS transistor Q2 and the nMOS transistor Q6 each turn off, and the bit line BL and the global bit line GBL are floating in a state of being pre-charged to VDD and VSS, respectively.

Then, when the cell selection period occurs, a signal voltage is read to the bit line BL at a time constant that corresponds to the high-resistance state of the memory cell 13 when the word line WL has changed to high. When the inverse signal /RE of the selection signal subsequently changes to low, the sense period begins, and the sense period ends when /RE changes to high.

During the sense period, since the potential of the bit line BL remains higher than the upper limit of the distribution of the threshold voltage Vt of the pMOS transistor Q1, the drain current of the pMOS transistor Q1 is small, and there is almost no charging of the parasitic capacitance of the Cgb of the global bit line GBL. Since the potential of the global bit line GBL at the end of the sense period stays substantially at VSS, the potential is detected as low by the global bit line sensing and writing circuit 30, inverted by an inversion circuit (not shown), and read as high data.

According to the embodiments described above, a configuration is adopted whereby the bit line capacitance is reduced when a signal is read from a memory cell, and rapid charging and discharging are thereby made possible even through a variable resistance memory cell having high resistance. The signal is therefore amplified by a single MOS transistor, and the surface area of the sense amplifier can thereby be significantly reduced. Through the use of a hierarchical bit line structure in which a plurality of sense amplifiers is connected to a global bit line, and information reading and writing control are performed through a global sense amplifier, compatibility with DRAM can be maintained while keeping the chip area and current consumption from increasing.

<Modification 1>

Figure 9:
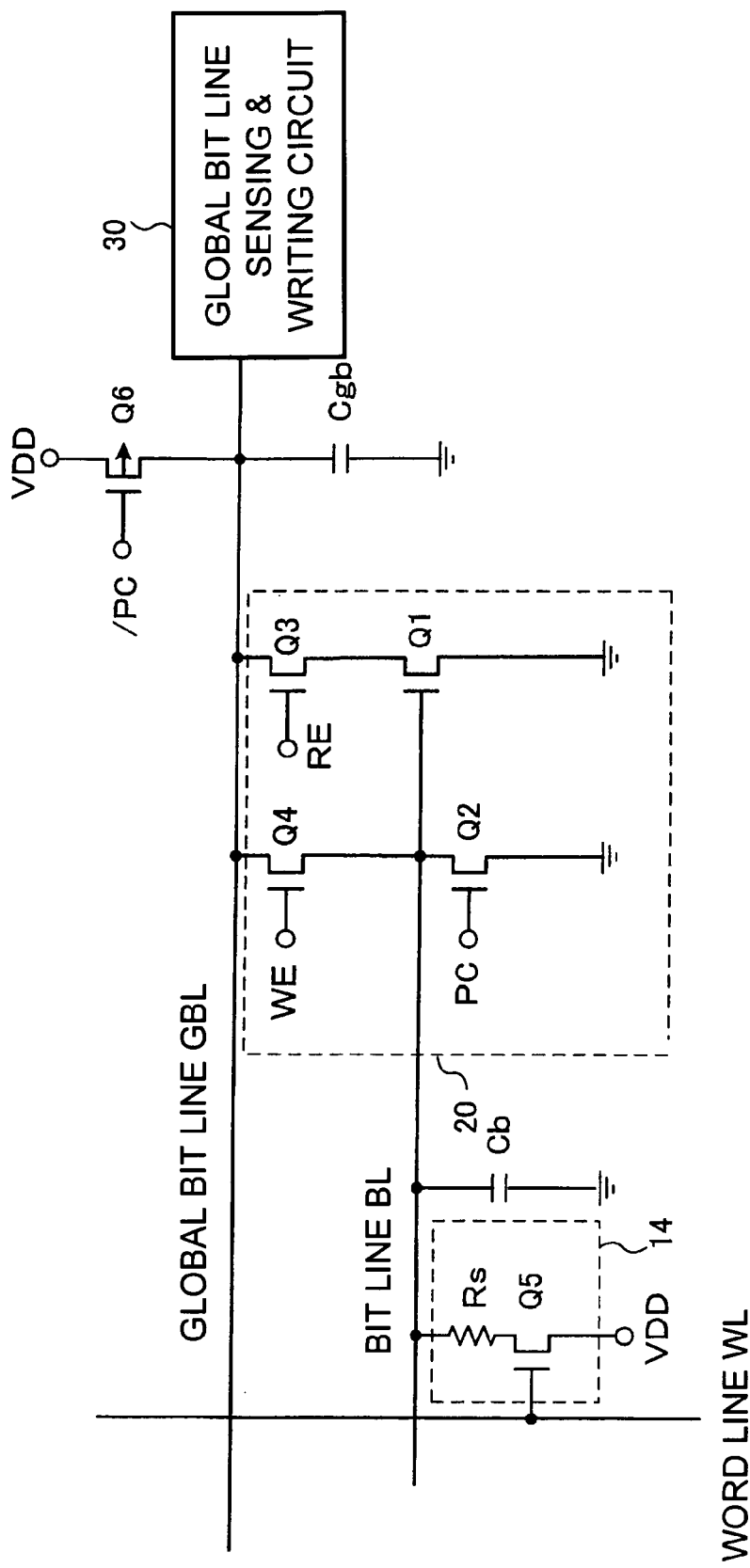
FIG. 9 is a diagram showing the structure of the memory cell and sense amplifier according to Modification 1.

FIG. 9 shows Modification 1 of the variable resistance memory cell. Since the structure of the sense amplifier portion is the same as in FIG. 1, the structure can also be applied to the circuits shown in FIGS. 3, 5, and 7.

The memory cell 14 of the present modification is composed of a selection nMOS transistor Q5 and a resistor element Rs for storing data on the basis of the size of a resistance value. The gate of the nMOS transistor Q5 is connected to the word line WL, the drain is connected to the power supply potential VDD, and the source is connected to one terminal of the resistor element Rs. The other terminal of the resistor element Rs is connected to the bit line BL. Operation when the memory cell 14 of the present modification is used is substantially the same as in FIG. 1, and operation when the memory cell 14 is applied to the circuits shown in FIGS. 3, 5, and 7 is substantially the same as the operation when the memory cells shown in FIGS. 3, 5, and 7 are used.

<Modification 2>

Figure 10:
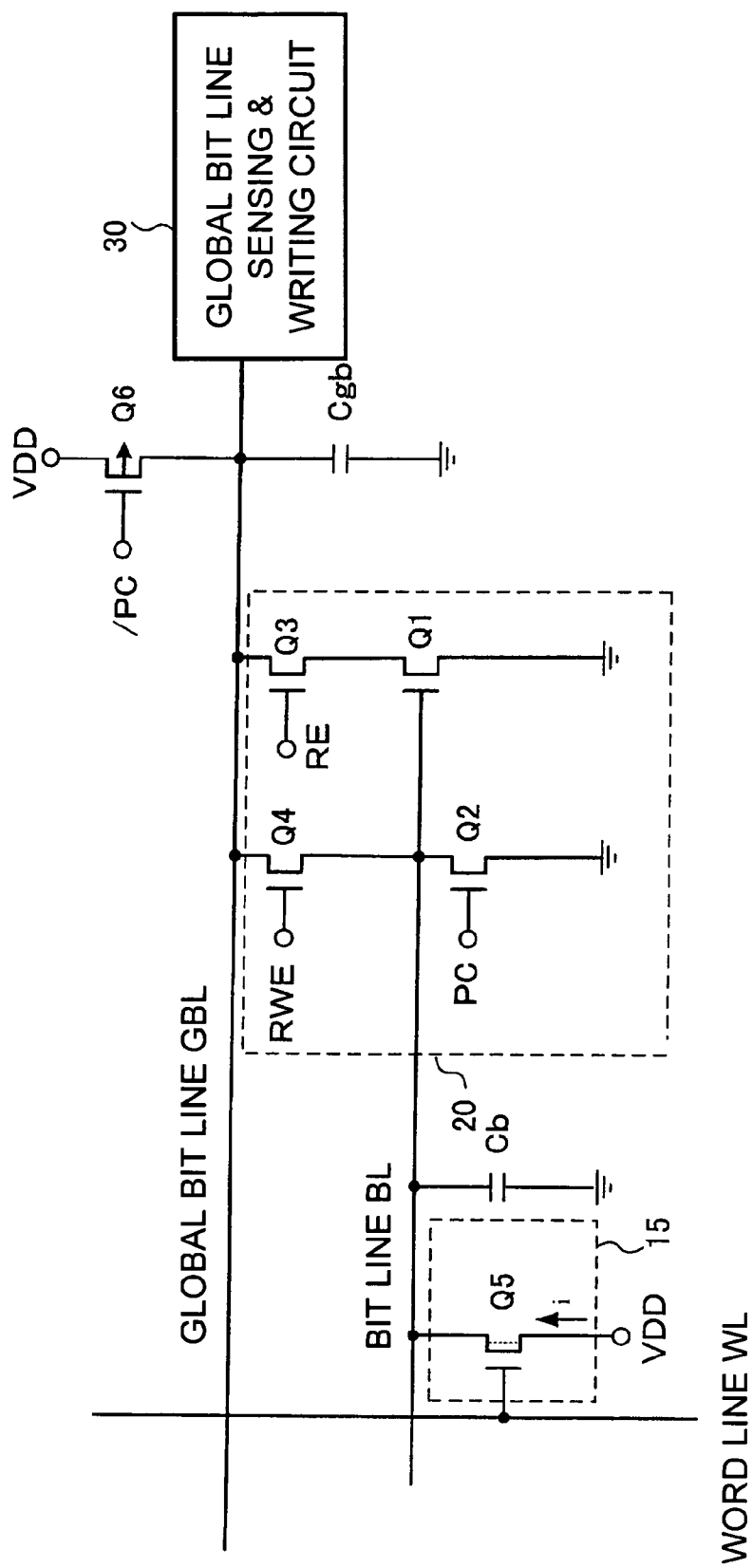
FIG. 10 is a diagram showing the structure of the memory cell and sense amplifier according to Modification 2.

FIG. 10 shows Modification 2 of the variable resistance memory cell. Since the structure of the sense amplifier portion is the same as in FIG. 1, the structure can also be applied to the circuits shown in FIGS. 3, 5, and 7.

The memory cell 15 of the present modification is composed of a floating-body nMOS transistor Q5, wherein the gate of the nMOS transistor Q5 is connected to the word line WL, the drain is connected to the power supply potential VDD, and the source is connected to the bit line BL.

In a state in which holes are accumulated in the floating body of the nMOS transistor Q5, the threshold voltage Vt of the nMOS transistor Q5 decreases, and the "on" resistance decreases. The lower limit i(H)min of the "on" current at this time is 10 µA, for example. When holes are not accumulated in the floating body of the nMOS transistor Q5, the threshold voltage Vt of the nMOS transistor Q5 increases, and the "on" resistance increases. The upper limit i(L)max of the "on" current at this time is 10 nA, for example. Since the current flowing through the resistor element in operation of the memory cells shown in FIGS. 1, 3, 5, and 7 is substantially equal to the "on" current of the nMOS transistor Q5 in the present modification, operation using the present modification is possible using the same control method as shown in FIGS. 2A, 2B, 4A, 4B, 6A, 6B, and 8A, 8B.

<Modification 3>

Figure 11:
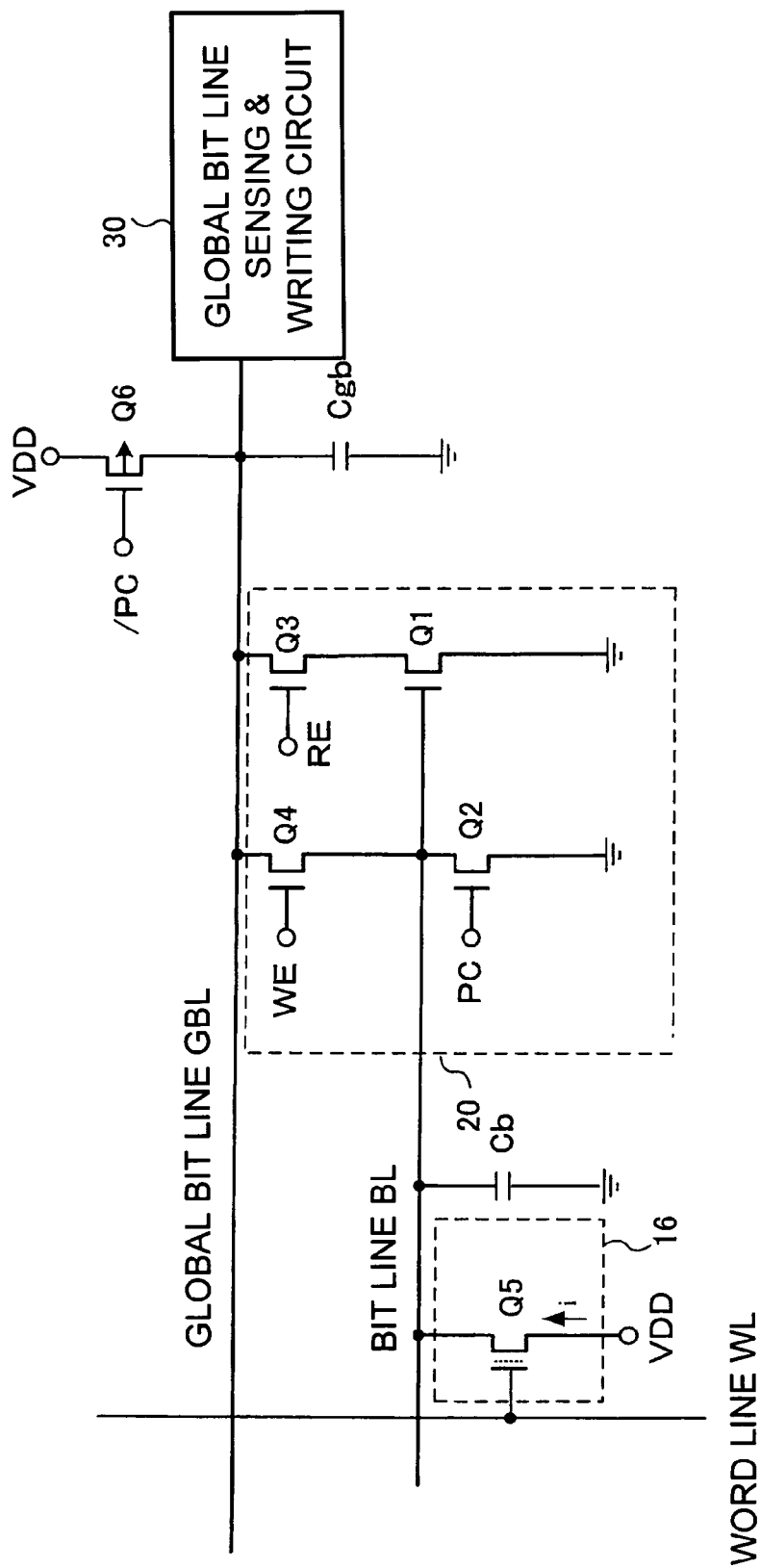
FIG. 11 is a diagram showing the structure of the memory cell and sense amplifier according to Modification 3.

FIG. 11 shows Modification 3 of the variable resistance memory cell. Since the structure of the sense amplifier portion is the same as in FIG. 1, the structure can also be applied to the circuits shown in FIGS. 3, 5, and 7.

The memory cell 16 of the present modification is composed of an nMOS transistor Q5 in which a charge trap region is provided in a gate insulation film, and information is stored according to a state in which electrons are accumulated in the charge trap region of the nMOS transistor Q5, and a state in which electrons are not accumulated in the charge trap region of the nMOS transistor Q5. The gate of the nMOS transistor Q5 is connected to the word line WL, the drain is connected to the power supply potential VDD, and the source is connected to the bit line BL.

In the state in which electrons are not accumulated in the charge trap region of the nMOS transistor Q5, the threshold voltage Vt of the nMOS transistor Q5 decreases, and the "on" resistance decreases. The lower limit i(H)min of the "on"

current at this time is 10 µA, for example. When electrons are accumulated in the charge trap region of the nMOS transistor Q5, the threshold voltage Vt of the nMOS transistor Q5 increases, and the "on" resistance increases. The upper limit i(L)max of the "on" current at this time is 10 nA, for example. Since the current flowing through the resistor element in operation of the memory cells shown in FIGS. 1, 3, 5, and 7 is substantially equal to the "on" current of the nMOS transistor Q5 in the present modification, operation using the present modification is possible using the same control method as shown in FIGS. 2A, 2B, 4A, 4B, 6A, 6B, and 8A, 8B.

<Modification 4>

Figure 12:
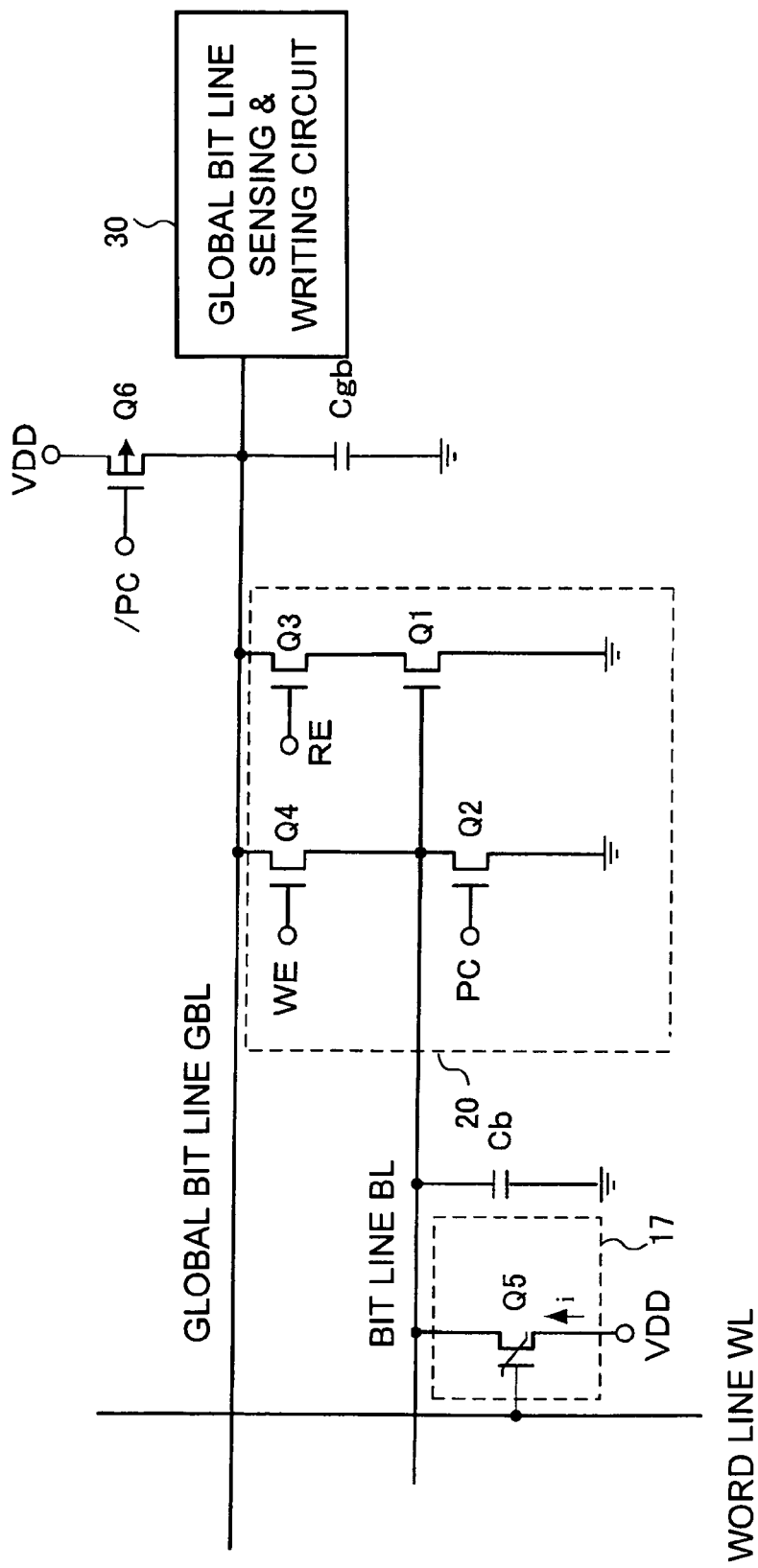
FIG. 12 is a diagram showing the structure of the memory cell and sense amplifier according to Modification 4.

FIG. 12 shows Modification 4 of the variable resistance memory cell. Since the structure of the sense amplifier portion is the same as in FIG. 1, the structure can also be applied to the circuits shown in FIGS. 3, 5, and 7.

The memory cell 17 of the present modification is composed of an nMOS transistor Q5 having a structure in which a ferroelectric is used in a gate insulation film, and information is stored according to the direction of polarization of the ferroelectric film. The gate of the nMOS transistor Q5 is connected to the word line WL, the drain is connected to the power supply potential VDD, and the source is connected to the bit line BL.

When the polarization direction of the ferroelectric film of the nMOS transistor Q5 is in a state in which the channel side is positive, the threshold voltage Vt of the nMOS transistor Q5 decreases, and the "on" resistance decreases. The lower limit i(H)min of the "on" current at this time is 10 µA, for example. When the polarization direction of the ferroelectric film of the nMOS transistor Q5 is in a state in which the channel side is negative, the threshold voltage Vt of the nMOS transistor Q5 increases, and the "on" resistance increases. The upper limit i(L)max of the "on" current at this time is 10 nA, for example. Since the current flowing through the resistor element in operation of the memory cells shown in FIGS. 1, 3, 5, and 7 is substantially equal to the "on" current of the nMOS transistor Q5 in the present modification, operation using the present modification is possible using the same control method as shown in FIGS. 2A, 2B, 4A, 4B, 6A, 6B, and 8A, 8B.

According to the modifications described above, the memory cell can be controlled by the same control method as the control method of the single-ended sense amplifier described above in the embodiments when the memory cell is composed of a resistor and a MOS transistor, of a floating-body MOS transistor, of a MOS transistor in which a charge trap region is provided in a gate insulation film, or of a MOS transistor in which a ferroelectric is used in a gate insulation film.

In the sense circuit according to the embodiments as described above, a signal voltage is amplified by a single MOS transistor, and the chip area is thereby prevented from increasing. The sense circuit can therefore also be used in a data processing system or the like that has a high degree of integration.

Embodiments of the disclosure were described in detail above with reference to the accompanying drawings, but the specific configuration of the disclosure is not limited by the embodiments, and the disclosure also encompasses designs and the like in ranges that do not depart from the intended scope of the disclosure.

For example, the polarities of the MOS transistors were configured as described above in the present embodiments, but it is also possible to form a circuit in which the polarities of the MOS transistors are all reversed. In this case, the relationship of the power supply potential and the ground is reversed, and the polarity of the control signal is also reversed.

Moreover, it will thus be appreciated that the embodiments described above are cited by way of example, and that the present disclosure is not limited to what has been particularly shown and described hereinabove. Rather, the scope of the present disclosure includes both combinations and subcombinations of the various features described hereinabove, as well as variations and modifications thereof which would occur to persons skilled in the art upon reading the foregoing description. The language of "present invention" or "invention" in this application and prosecution should not be improperly interpreted as limiting the scope of the application or claims.

What is claimed is:

1. A semiconductor device comprising:
    a memory cell that stores information based on a resistance value between an input/output terminal and a power supply terminal, or an ON current value of a cell transistor connected to the input/output terminal;
    a bit line connected to the input/output terminal that inputs and ouputs the information to and from the memory cell, respectively;
    a first field-effect transistor that works as a single-ended sense amplifier having a gate connected to the bit line that amplifies a data signal on the bit line;
    a second field-effect transistor connected to the bit line that controls a potential of the bit line to a first predetermined potential;
    a third field-effect transistor that supplies an output signal of the first field-effect transistor to a global bit line; and
    a global bit line sense amplifier connected to the global bit line that detects a signal on the global bit line, wherein
    the first predetermined potential of the bit line varies in accordance with a current flowing through the memory cell, and the first field-effect transistor flows a current in accordance with the varied potential of the bit line.

2. The semiconductor device as claimed in claim 1, wherein the second field-effect transistor controls the potential of the bit line to the first predetermined potential before the information is outputted from the memory cell to the bit line.

3. The semiconductor device as claimed in claim 1, wherein the third field-effect transistor is brought into a conductive state for a predetermined time after the memory cell is accessed, thereby the first field-effect transistor flows the current in accordance with varied potential of the bit line.

4. The semiconductor device as claimed in claim 1, wherein
    the bit line and the global bit line constitute a hierarchical structure,
    the memory cell includes a selection terminal connected to a word line,
    the power supply terminal is connected to a first power supply,
    the first field-effect transistor includes a source connected to a second power supply,
    the second field-effect transistor includes a gate connected to a first signal line, a source connected to a third power supply, and a drain connected to the bit line,
    the third field-effect transistor includes a gate connected to a second signal line, a source connected to a drain of the first field-effect transistor, and a drain connected to the global bit line, and
    the first power supply and the third power supply have different voltage values, whereby the first predetermined potential is given to the bit line, and the first predetermined potential varies in accordance with the current flowing through the memory cell.

5. The semiconductor device as claimed in claim 1, wherein a first time constant based on a relatively high resistance value that corresponds to first information of the memory cell and a capacitance of the bit line is approximately 1,000 or more times larger than a second time constant based on a relatively low resistance value that corresponds to second information of the memory cell and the capacitance of the bit line.

6. The semiconductor device as claimed in claim 1, further comprising a fourth field-effect transistor connected between the bit line and the global bit line that writes information to the memory cell.

7. The semiconductor device as claimed in claim 1, wherein
the power supply terminal of the memory cell is connected to a first power supply,
the first field-effect transistor includes a source connected to a second power supply and a drain coupled to the global bit line via the third field-effect transistor, and
the second field-effect transistor includes a source connected to a third power supply and a drain connected to the bit line,
the semiconductor device further comprising a fifth field-effect transistor connected between the global bit line and a fourth power supply that controls a potential of the global bit line to a second predetermined potential, wherein
the first power supply and the third power supply have different voltage values, whereby the first predetermined potential is given to the bit line, and the first predetermined potential varies in accordance with the current flowing through the memory cell, and
the second power supply and the fourth power supply have different voltage values, whereby the second predetermined potential is given to the global bit line, and the second predetermined potential varies in accordance with the current flowing through the first field-effect transistor.

8. The semiconductor device as claimed in claim 7, wherein the third power supply and the fourth power supply have different voltage values.

9. The semiconductor device as claimed in claim 7, wherein the third power supply and the fourth power supply have the same voltage value.

10. The semiconductor device as claimed in claim 1, wherein the memory cell includes a resistor including a resistance value which differs according to stored information and a field-effect transistor.

11. The semiconductor device as claimed in claim 1, wherein the memory cell includes one of a floating body field-effect transistor, a field-effect transistor provided with a charge trap region in a gate insulating film, and a field-effect transistor having a ferroelectric material in a gate insulating film.

12. The semiconductor device as claimed in claim 1, wherein:
the second field-effect transistor is brought into a conductive state so as to set the bit line to the first predetermined potential before the memory cell is accessed, and
the first predetermined potential of the bit line varies in accordance with a current flowing through the memory cell after the memory cell is accessed, and
the first field-effect transistor flows a current in accordance with the varied potential of the bit line.

13. The semiconductor device as claimed in claim 12, wherein the third field-effect transistor is brought into a conductive state for a predetermined time after the memory cell is accessed, thereby the first field-effect transistor flows the current in accordance with varied potential of the bit line.

14. The semiconductor device as claimed in claim 12, further comprising a fifth field-effect transistor connected between the global bit line and a fourth power supply that controls the global bit line to a second predetermined potential, wherein
the fifth field-effect transistor is brought into a conductive state so as to set the global bit line to the second predetermined potential before the memory cell is accessed, and the second predetermined potential of the global bit line varies in accordance with a current flowing through the first field-effect transistor after the memory cell is accessed.

15. The semiconductor device as claimed in claim 13, wherein the voltage of the bit line becomes lower than a threshold voltage of the first field-effect transistor in accordance with a current that flows with a relatively high resistance value that corresponds to first information of the memory cell, and the voltage of the bit line becomes higher than the threshold voltage of the first field-effect transistor in accordance with a current that flows with a relatively low resistance value that corresponds to second information of the memory cell, when the third field-effect transistor is brought into a conductive state for the predetermined time.

16. The semiconductor device as claimed in claim 1, wherein:
the first predetermined potential of the bit line varies in accordance with a current flowing through the memory cell and a current flowing through the second field-effect transistor, and
the first field-effect transistor flows a current in accordance with the varied potential of the bit line.

17. The semiconductor device as claimed in claim 16, wherein the third field-effect transistor is brought into a conductive state for a predetermined time after the memory cell is accessed, thereby the first field-effect transistor flows the current in accordance with varied potential of the bit line.

18. The semiconductor device as claimed in claim 16, further comprising a fifth field-effect transistor connected between the global bit line and a fourth power supply that controls the global bit line to a second predetermined potential, wherein
the second predetermined potential of the global bit line varies in accordance with a current flowing through the first field-effect transistor and a current flowing through the fifth field-effect transistor.

19. The semiconductor device as claimed in claim 17, wherein the voltage of the bit line becomes lower than a threshold voltage of the first field-effect transistor in accordance with a current that flows with a relatively high resistance value that corresponds to first information of the memory cell, and the voltage of the bit line becomes higher than the threshold voltage of the first field-effect transistor in accordance with a current that flows with a relatively low resistance value that corresponds to second information of the memory cell, when the third field-effect transistor is brought into a conductive state for the predetermined time.

20. The semiconductor device as claimed in claim 16, further comprising a fourth field-effect transistor connected between the bit line and the global bit line that writes information to the memory cell.

21. A semiconductor device, comprising:

a memory cell that stores information according to a resistance value between any of an input and output terminal and a power supply terminal, and an ON current value of a cell transistor connected to the input and output terminal;

a first transistor providing a single-ended sense amplifier, the first transistor including a first electrode of a principal electrically conducting channel, a second electrode of the principal electrically conducting channel, and a control electrode, the control electrode regulating a current flow between the first electrode and the second electrode of the principal electrically conducting channel, the first transistor including the control electrode connected to the memory cell that amplifies a data signal to the memory cell;

a second transistor connected to the memory cell that controls a potential of a line connected to the memory cell to a first predetermined potential;

a third transistor that supplies an output signal of the first transistor to a second line; and a sense amplifier connected to the second line that detects a signal on the second line, wherein the first predetermined potential of the line varies in accordance with a current flowing through the memory cell, and the first transistor flows a current in accordance with the varied potential of the line.

22. The semiconductor device as claimed in claim 21, wherein the second transistor controls the potential of the line to the first predetermined potential before the information is outputted from the memory cell to the line.

23. The semiconductor device as claimed in claim 21, wherein the third transistor transitions into a conductive state for a predetermined time after the memory cell is accessed, wherein the first transistor flows the current in accordance with varied potential of the line connected to the memory cell.

24. The semiconductor device as claimed in claim 21, wherein the line and the second line constitute a hierarchical structure, the first transistor has one of a first and second electrode connected to a second power supply, and the second transistor has a control electrode connected to a first signal line, a first electrode connected to a third power supply, and a second electrode connected to the line, where the control electrode of the second transistor regulates a current flow between the first electrode and the second electrode of the principal electrically conducting channel.

* * * * *